(12) United States Patent
Miyajima

(10) Patent No.: US 6,262,794 B1
(45) Date of Patent: *Jul. 17, 2001

(54) EXPOSURE APPARATUS AND DEVICE MANUFACTURING METHOD

(75) Inventor: Yoshikazu Miyajima, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/046,553

(22) Filed: Mar. 24, 1998

(30) Foreign Application Priority Data

Mar. 25, 1997 (JP) ................................................ 9-088655
Mar. 10, 1998 (JP) ............................................... 10-075034

(51) Int. Cl.[7] ........................... G03B 27/42; G03B 27/58; G03B 27/62
(52) U.S. Cl. ................................. 355/53; 355/72; 355/75
(58) Field of Search ............................... 355/53, 67, 71, 355/72, 74, 75; 356/399, 400; 250/548; 318/625, 632, 687

(56) References Cited

U.S. PATENT DOCUMENTS

| | | | |
|---|---|---|---|
| 4,708,465 | * 11/1987 | Isohata et al. ........................... | 355/53 |
| 5,477,304 | * 12/1995 | Nishi ...................................... | 355/53 |
| 5,504,407 | * 4/1996 | Wakui et al. ..................... | 318/568.17 |
| 5,511,930 | * 4/1996 | Sato et al. ............................. | 414/676 |
| 5,684,856 | * 11/1997 | Itoh et al. ................................ | 378/34 |
| 5,699,145 | * 12/1997 | Makinouchi et al. ................. | 355/53 |
| 5,777,721 | * 7/1998 | Makinouchi ........................... | 355/53 |
| 5,796,469 | * 8/1998 | Ebinuma ................................ | 355/53 |
| 5,828,573 | * 10/1998 | Hayashi ........................... | 364/468.28 |
| 5,841,250 | * 11/1998 | Korenage et al. .................... | 318/315 |
| 5,850,280 | * 12/1998 | Ohtomo et al. ........................ | 355/53 |

FOREIGN PATENT DOCUMENTS 3-21894   1/1991  (JP) .
3-107639  5/1991  (JP) .

* cited by examiner

Primary Examiner—Alan A. Mathews
Assistant Examiner—Hung Henry Nguyen
(74) Attorney, Agent, or Firm—Fitzpatrick, Cella, Harper & Scinto

(57) ABSTRACT

An exposure apparatus includes a projection optical system for projecting, in a slit, a pattern of an original onto a substrate, the original being held by a stage and being moved in a scan direction, along a straight line, a scanning device for relatively and scanningly moving the original and the substrate relative to the projection optical system, such that in association with the projection optical system the pattern of the original is transferred to the substrate, and a movable member being movable along the same straight line as that of the scan direction of the stage. In a scan exposure, the stage and the movable member move in synchronism with each other, along the same straight line and in directions opposite to each other.

28 Claims, 17 Drawing Sheets

EXPOSURE APPARATUS AND DEVICE MANUFACTURING METHOD

FIELD OF THE INVENTION AND RELATED ART

This invention relates to an exposure apparatus for use in a process of semiconductor device manufacture and, more particularly, to a projection exposure apparatus for projecting and transferring a pattern of a reticle onto a silicon wafer. Specifically, the invention is concerned with a scanning exposure apparatus for projecting and printing a pattern of a reticle onto a silicon wafer while scanningly moving the reticle and the wafer in synchronism with each other, relative to a projection exposure system.

In simultaneous-exposure type exposure apparatuses (called a stepper), if the projection optical system is provided by lenses, the imaging region thereof has a circular shape. Generally, however, a semiconductor integrated circuit has a rectangular shape and, therefore, the transfer region defined in the simultaneous exposure process has to be a rectangular region inscribed within the circular imaging region of the projection optical system. Thus, even a largest transfer region has a size of a square with each side corresponding to $1/\sqrt{2}$ of the diameter of the circle.

On the other hand, a scanning exposure method (step-and-scan exposure method) has been proposed, in accordance with which a slit-like exposure region having a size approximately equal to the diameter of the circular imaging region of a projection optical system is used and in which a reticle and a wafer are scanningly moved in synchronism with each other, thereby to expand the transfer region. In this method, if a projection optical system with an imaging region of the same size is used, use of a projection lens system enables simultaneous exposure to individual transfer regions of a larger size as compared with that defined in the case of steppers. More specifically, with regard to the scan direction, there is no restriction by the optical system and, therefore, a size corresponding to the stroke of the scanning stage is assured. With regard to a direction perpendicular to the scan direction, a transfer region of a size approximately equal to $\sqrt{2}$ times is assured.

For exposure apparatuses for the manufacture of the semiconductor integrated circuits, enlargement of the transfer region and improvement of the resolving power have been desired from the viewpoint of manufacture of higher density chips. The usability of a smaller projection optical system is advantageous in the point of optical performance and, also, in the point of cost. Thus, the step-and-scan exposure method will be the most effective in future exposure apparatuses.

Such a step-and-scan exposure method, however, involves some problems.

FIG. 14 is a schematic view of a step-and-scan exposure apparatus as described above. In this exposure apparatus, a portion of a pattern of a reticle substrate 102 mounted on a reticle stage 101 is projected onto a wafer 6, mounted on a wafer stage 7, through a projection optical system 12, while the reticle substrate 102 and the wafer 6 are moved in the Y direction, relative to the projection optical system 12, in synchronism with each other, whereby the pattern of the reticle substrate 102 is transferred to the wafer 6 held by the wafer stage 7. Stepwise motion is added to repeat the scan exposure to different transfer regions (shot areas) on the wafer 6, whereby step-and-scan exposures are performed.

The reticle stage 101 is moved in the Y direction, as shown in FIG. 16A, by means of a linear motor (103A, 103B, 103C and 103D) having a symmetrical structure on the opposite sides of the stage. Denoted at 103A and 103B are coils for actuating the reticle stage 101, and denoted at 103C and 103D are yokes of a magnetic circuit, comprising magnets, for applying a magnetic field to the coils 103A and 103B.

During the exposure process with this exposure apparatus, the reticle stage 101 scanningly moves in the Y direction (FIGS. 16A and 16B, and FIGS. 17A–17E). Prior to a start of a scanning motion of the reticle stage 101 (FIG. 17B), the weight or load gravity center position of the reticle stage 101 is in the distance C from the end face of the reticle stage with respect to the Y direction. Just after the scan exposure and at the moment the reticle stage 101 has just moved in the Y direction (FIG. 17C), the load gravity center of the reticle stage 101 displaces, with the stage movement, to the position in the distance D from the stage end face with respect to the Y direction. Further, after completion of the scan exposure, the reticle stage 101 moves back to the position shown in FIG. 17D, for preparation of the subsequent exposure operation. Thus, as the scan exposure proceeds, and before and after the scan exposure, the load gravity center position of the reticle stage 101 displaces in the Y direction, between the ranges of distance C to the distance D in synchronism with the movement of the reticle stage 101. As a result, as shown in FIG. 17E, at the positions C and D, loads $W_C$ and $W_D$ are applied from the reticle stage 101 to the structural member 113 which supports the stage 101. In response, the top plate displaces in the Z direction to produce flexure deformation Z. In this manner, the scan exposure is performed with deformation of the structural member 113 produced. Such deformation of the structural member 113 then causes tilt of the reticle stage 101 or distortion within the supporting system of the reduction exposure system or in the whole exposure optical system. It causes degradation of exposure precision.

Further, with the scanning motion of the reticle stage 101, thrust and a reaction force thereto are produced in the linear motor coil 103B and yoke 103D for moving the reticle stage 101 (FIGS. 18A–18C). At the start of scanning motion of the reticle stage 101 (FIG. 18A), a thrust $F_f$ is produced in the linear motor coil 103B (103A) and, in response, a reaction force $F_f'$ is produced in the fixed side yoke 103D (103C). The reaction force $F_f'$ produced in the yoke 103D (103C) directly acts on the structural member 113 on which the yoke 103D (103C) is fixed. Thus, a reaction force is produced in the direction for moving the structure 113 in the -Y direction. As a result, a small shift and vibration are produced in the structural member 113 as well as in a barrel base table 11.

Such a small shift and vibration serve as a disturbance to the scanning exposure system and, during the synchronous scan of the reticle stage 101 and the wafer stage 7 in the scanning exposure operation, it is an unstable control factor for an exposure control system that should function to assure exposure precision stability.

Japanese Laid-Open Patent Application, Laid-Open No. 21894/1991 or No. 107639/1991 shows an exposure apparatus wherein, in relation to a wafer (not a reticle), a balancer which is movable in a vector direction opposite to the movement direction of a wafer stage is provided to reduce vibration of the wafer stage with acceleration and deceleration.

However, this arrangement requires completely separate drive sources for the stage and for the balancer. Further, the drive source uses a feed-screw mechanism. This necessitates enlargement of size and weight of the structure.

Additionally, since the movement axis of gravity center of the stage is not registered with the movement axis of gravity center of the balancer, operational axes of reaction forces of the stage and the balancer do not match with each other. This causes a moment force between them during the motion and, as a result, complete balancing is not attainable. This problem is particularly serious in the case of a reticle stage whose gravity center position is generally higher than that of the wafer stage.

SUMMARY OF THE INVENTION

It is an object of the present invention to provide an arrangement suitable for use in an exposure apparatus, by which, when used in an exposure apparatus, deformation of a structure due to a shift of weight or load gravity center of a reticle stage during scanning motion of the reticle stage, or small displacement or vibration of the structure or of a barrel base table due to a reaction force as produced in a fixed yoke of a linear motor during the scanning exposure, can be prevented or reduced, such that the total throughput or exposure precision of the exposure apparatus can be improved.

In accordance with an aspect of the present invention, there is provided an exposure apparatus, comprising: a projection optical system for projecting, in a slit, a pattern of an original onto a substrate; scanning means for relatively and scanningly moving the original and the substrate relative to the projection optical system, such that in association with said projection optical system the pattern of the original is transferred to the substrate; and a movable member being movable in a direction opposite to a scan direction of a stage for holding the original, wherein in the scan exposure the stage and said movable member move in synchronism with each other, substantially along the same axis and in opposite directions.

In accordance with another aspect of the present invention, there is provided a device manufacturing method including an exposure process to be performed by use of an exposure apparatus as recited above.

In accordance with a further aspect of the present invention, there is provided a stage mechanism, comprising: a stage being movable while carrying thereon an article to be conveyed; a movable member being movable in a direction opposite to the movement direction of said stage; and linear motor means for moving said stage and said movable member, wherein said stage and said movable member are moved by said linear motor means in synchronism with each other, substantially along the same axis and in opposite directions.

In one preferred form of the present invention, a movable member being movable substantially along the same axis as the scanning movement direction of a reticle stage and in an opposite direction thereto as well as driving means (dynamic damper) are so provided to use, in common, a reticle stage guide and a stationary side yoke of a magnetic circuit (where the coil is provided at the stationary side) or a coil support (where a magnet is provided at the stationary side).

In this structure, the movable member is movement controlled so as to cancel a shift of load gravity center position of the reticle stage unit due to scan motion of the reticle stage and a reaction force produced in the linear motor stationary side, such that it functions as a dynamic damper. With this arrangement, the inconveniences as described hereinbefore can be avoided.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will be described with reference to the drawings.

Figure 1:
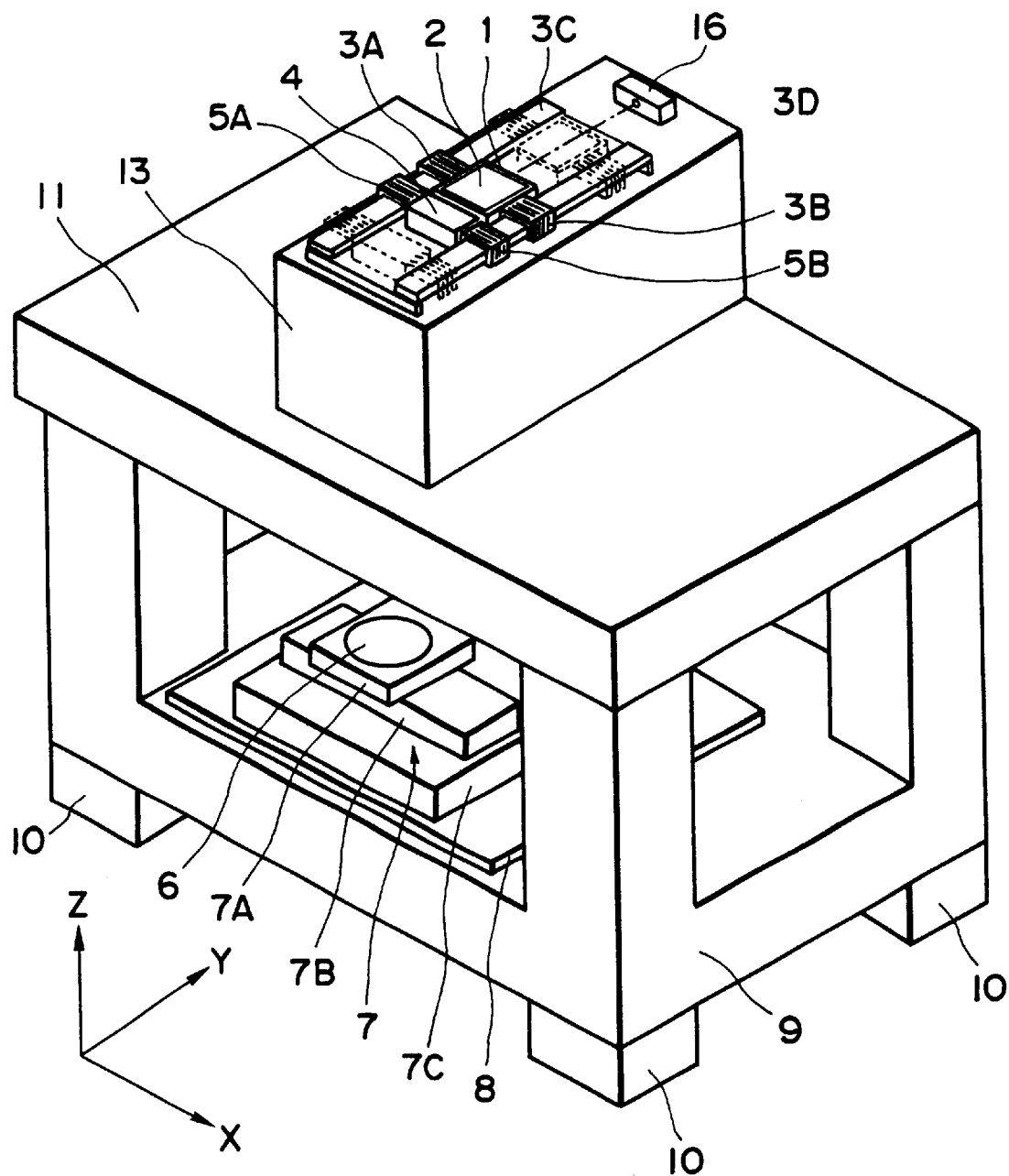
FIG. 1 is a perspective view of a general structure of an exposure apparatus according to an embodiment of the present invention.
Figure 2:
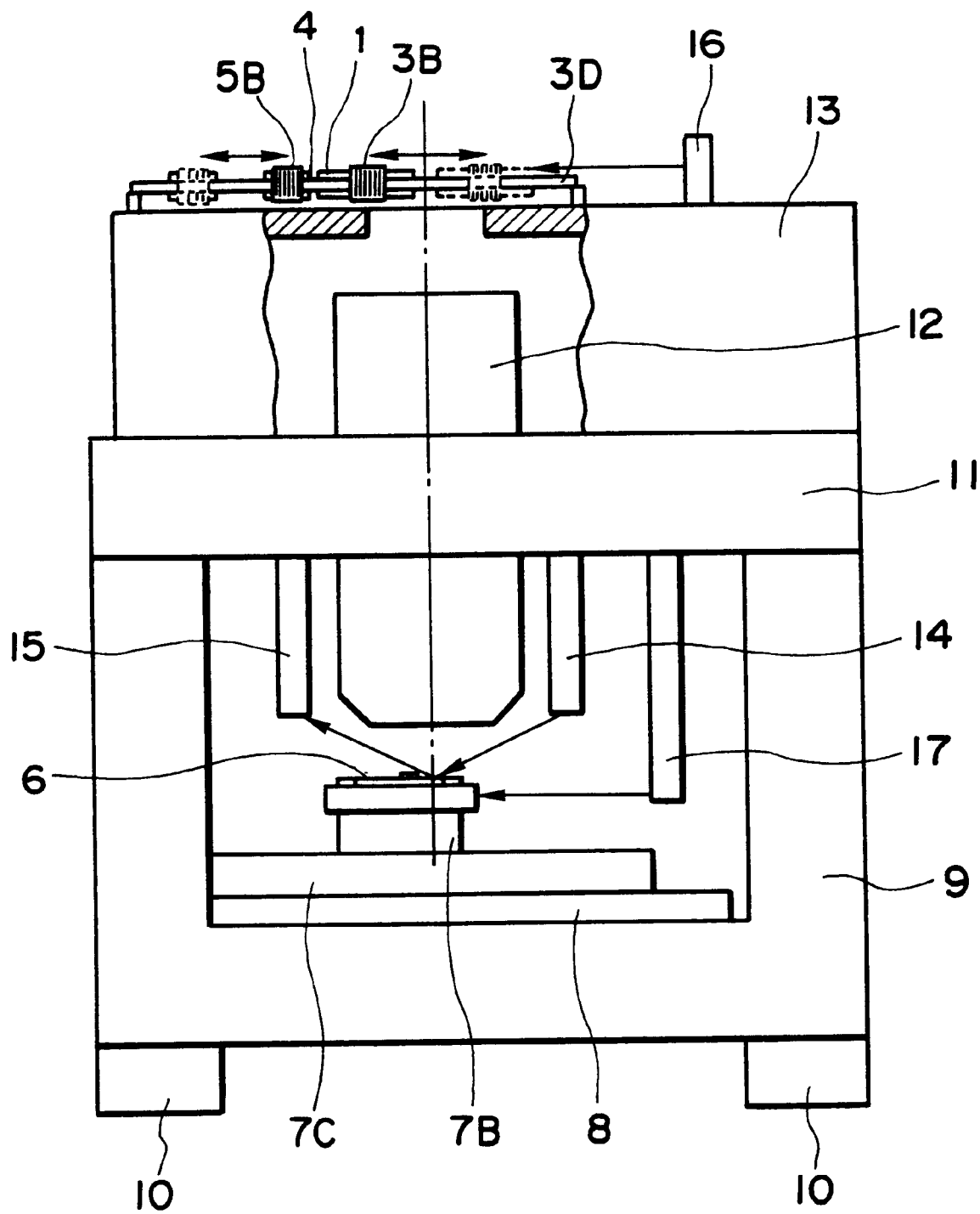
FIG. 2 is side view of the exposure apparatus of the FIG. 1 embodiment.

FIG. 1 is a perspective view of the appearance of an exposure apparatus according to an embodiment of the present invention. FIG. 2 is a schematic and side view of the exposure apparatus of FIG. 1.

As shown in these drawings, this exposure apparatus comprises a step-and-scan type exposure apparatus wherein a portion of a pattern of a reticle substrate 2, mounted on a reticle stage 1, is projected through a projection optical system 12 onto a wafer 6 mounted on a wafer stage 7. On the other hand, the reticle substrate 2 and the wafer 6 are relatively and scanningly moved in synchronism with each other, relative to the projection optical system 12, whereby the pattern of the reticle substrate 2 is transferred to the wafer 6 on the wafer stage 7. The synchronous scan movement in the Y direction and the reticle pattern transfer thereby are repeated to different transfer regions (shot areas) on the wafer 6, with interposition of stepwise motion.

The reticle stage 1 is moved by a linear motor 3 in the Y direction, while an X-stage 7B of the wafer stage 7 is moved by another linear motor (not shown) in the X direction. A Y-stage 7C of the wafer stage is moved by another linear motor (not shown) in the Y direction.

Figure 5:
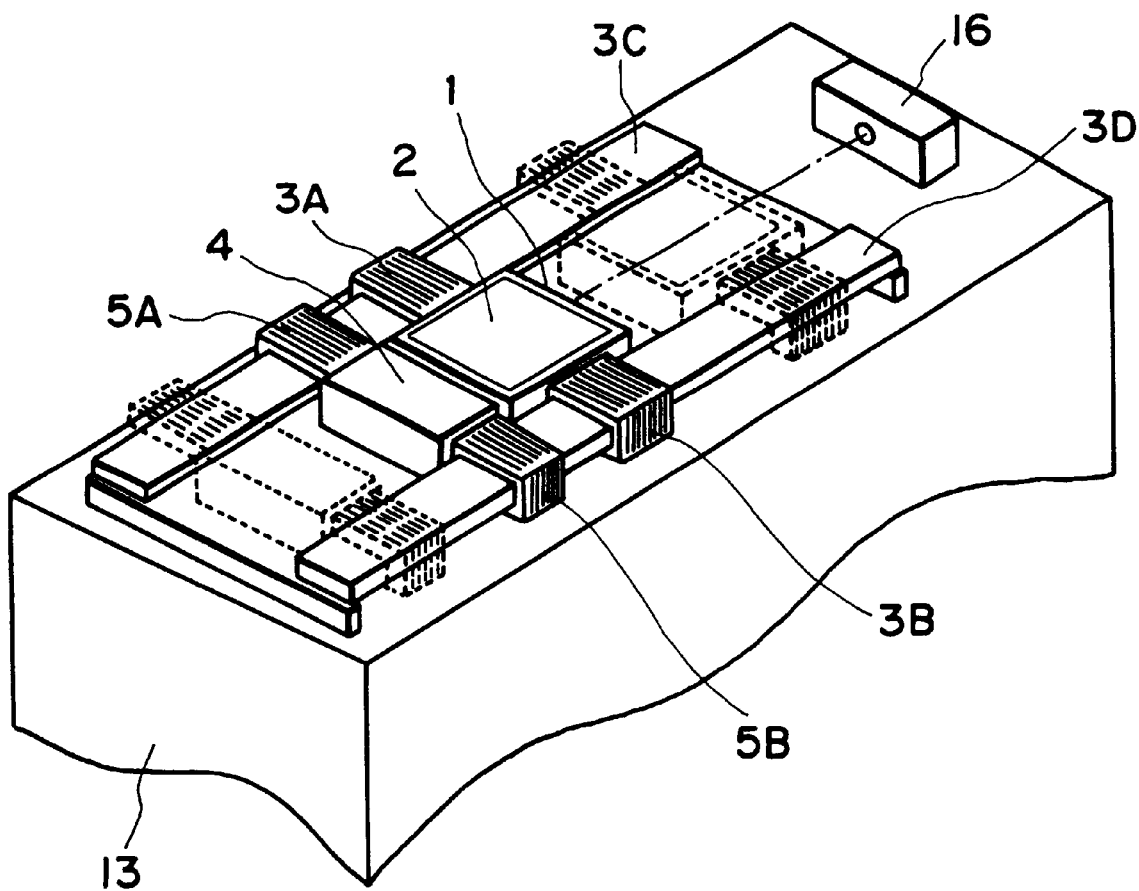
FIG. 5 is a fragmentary and schematic view of the reticle stage in the FIG. 1 embodiment.
Figure 6A:
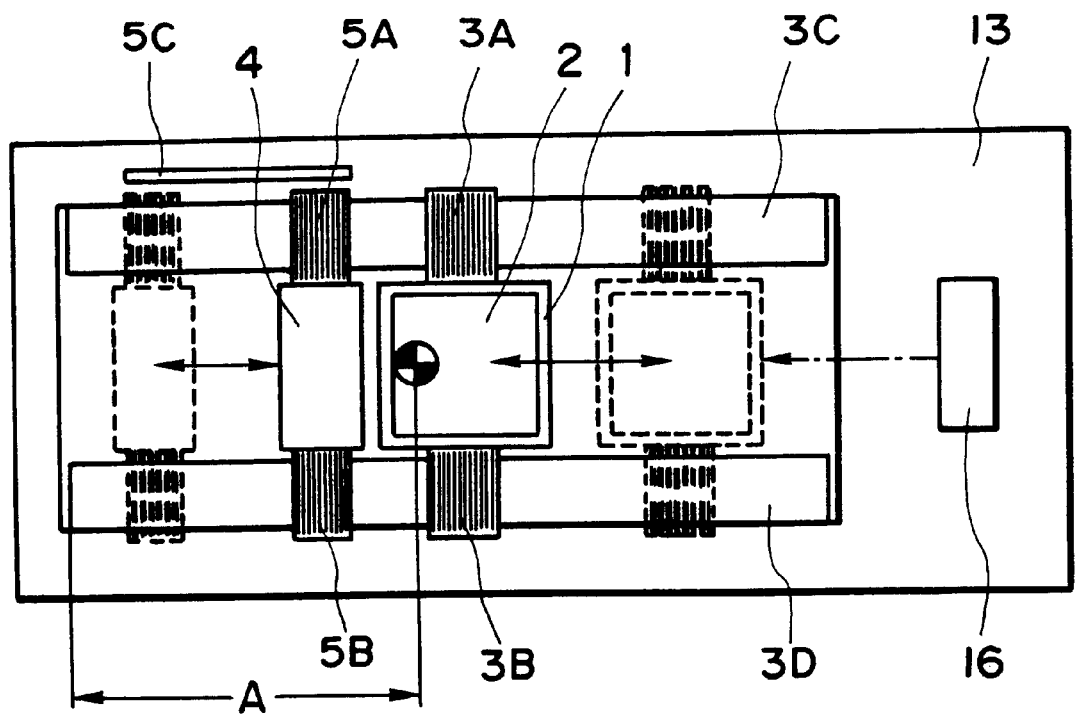
FIGS. 6A and 6B are a top view and side view of the reticle stage of the FIG. 1 embodiment, respectively.
Figure 6B:
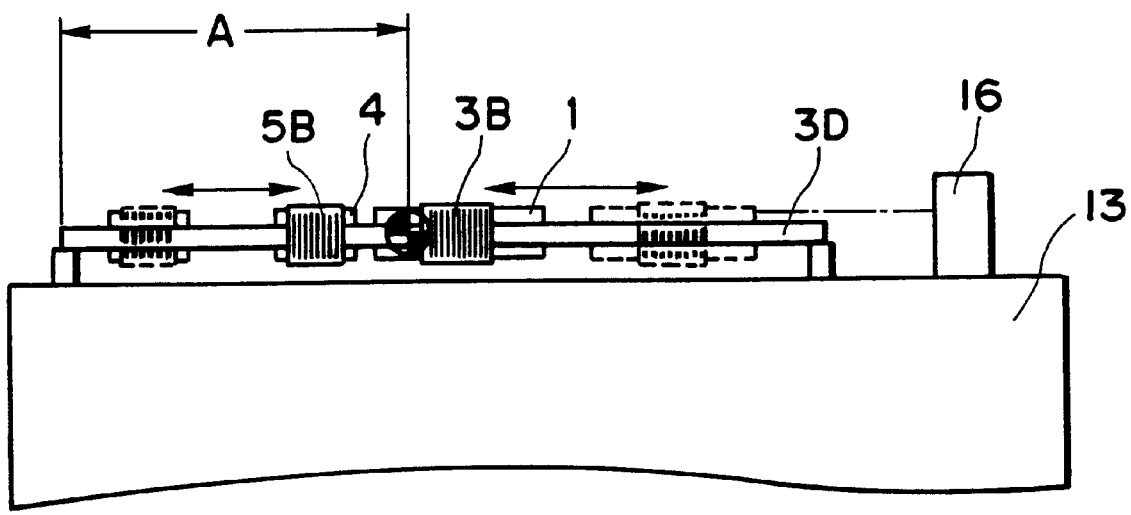

In this embodiment, as shown in FIGS. 5, 6A and 6B, there is a movable portion 4 which is movable along the Y direction of the reticle stage 1 and in a diametrically opposite direction to the scanning movement direction of the reticle stage 1, and which supports the combined weight of the reticle stage 1 and the reticle substrate 2. On the opposite sides of the movable portion 4, there are linear motor coils 5A and 5B which are operationally associated with yokes 3C and 3D of the linear motor 3 to provide moving means for moving the movable portion 4.

In FIGS. 1 and 2, mounted outside the linear motor coil 5A is a position sensor 5C for detecting the position of the linear motor coil 5A in the Y direction. As the reticle stage 1 scanningly moves, on the basis of a detection signal from the position sensor 5C and of measurement of the Y direction position of the reticle stage 1 through a laser interferometer 16, the reticle stage is driven while the movement distance and movement speed of the reticle stage 1 and the movable portion 4 are controlled.

A synchronous scan of the reticle substrate 2 and the wafer 6 is performed by moving the reticle stage 1 and the Y stage 7C in the Y direction at a constant speed ratio (e.g., 4:−1 where the sign "−" means that the direction is inverse). Also, the stepwise motion in the X direction is performed by means of the X stage 7B. The X stage 7B is provided with a Z stage 7A for movement in the Z direction and for e adjustment about the Z axis. The wafer stage 7 is mounted on a stage base table 8 which is disposed horizontally, at a high precision, with respect to a base frame 9. The reticle stage 1 and the projection optical system 12 are mounted on a barrel base table 11, and it is supported on the base frame placed on a floor, for example. Damper 10 comprises an active damper and it serves to suppress or isolate external vibration transmitted to the base frame 9 from the floor, for example. The damper may be a passive damper or, alternatively, the frame may be supported without a damper.

The exposure apparatus is equipped with a focus sensor for detecting whether the wafer 6 on the wafer stage 7 is positioned at the focus plane of the projection optical system 12 or not. More specifically, light projecting means 14 fixedly mounted on the barrel base table 11 projects light to the wafer 6 in an oblique direction, and light receiving means 15 detects the position of reflected light, by which the position of the wafer surface with respect to the optical axis direction of the projection optical system is detected.

As shown in FIG. 2, light emitted by a laser interferometer light source (not shown) is introduced into a reticle stage Y-axis laser interferometer 16. The light thus introduced into the Y-direction laser interferometer 16 is divided by a beam splitter (not shown) inside the laser interferometer 16, into light directed to a fixed mirror (not shown) within the laser interferometer and light directed to a Y-direction movable mirror (not shown). The light directed to the Y-direction movable mirror goes along a Y-direction distance measurement light path, and it impinges on the Y-direction movable mirror which is fixedly mounted on the reticle stage 1. The light reflected by this mirror goes again along the Y-direction measurement light path, back to the beam splitter inside the laser interferometer, such that is it superposed on the light reflected by the fixed mirror. On the basis of a detection of changes in interference of light there, the movement distance in the Y direction is measured. The movement distance information thus measured is fed back to a scan control system (not shown), and the positioning control of the scan position of the reticle stage is performed.

On the other hand, light emitted by a laser interferometer light source (not shown) is introduced into a wafer stage Y-direction laser interferometer 17. The light thus introduced into the Y-direction laser interferometer 17 is divided by a beam splitter (not shown) inside the laser interferometer 17, into light directed to a fixed mirror (not shown) within the laser interferometer 17 and light directed to a Y-direction movable mirror (not shown). The light directed to the Y-direction movable mirror goes along a Y-direction distance measurement light path, and it impinges on the Y-direction movable mirror which is fixedly mounted on the wafer stage 7. The light reflected by this mirror goes again along the Y-direction measurement light path, back to the beam splitter inside the laser interferometer 17, such that is it superposed on the light reflected by the fixed mirror. On the basis of a detection of changes in interference of light there, the movement distance in the Y direction is measured. The movement distance information thus measured is fed back to a scan control system (not shown), and the positioning control of the scan position of the wafer stage 7 is performed.

Also, similarly to the Y-direction measurement, light emitted by a laser interferometer light source (not shown) is introduced into a wafer stage X-direction laser interferometer (not shown). The light thus introduced into the X-direction laser interferometer is divided by a beam splitter (not shown) inside the laser interferometer, into light directed to a fixed mirror (not shown) within the laser interferometer and light directed to an X-direction movable mirror (not shown). The light directed to the X-direction movable mirror goes along an X-direction distance measurement light path, and it impinges on the X-direction movable mirror which is fixedly mounted on the wafer stage 7. The light reflected by this mirror goes again along the X-direction measurement light path, back to the beam splitter inside the laser interferometer, such that it is superposed on the light reflected by the fixed mirror. On the basis of a detection of changes in interference of light there, the movement distance in the X direction is measured. The movement distance information thus measured is fed back to a scan control system (not shown), and the positioning control of the scan position of the wafer stage 7 is performed.

Denoted at 13 is a structural member for fixedly supporting yokes 3C and 3D which are provided at the stationary side of the linear motor (driving means) for the reticle stage 1. The structural member is mounted on the barrel base table 11.

A wafer is conveyed by wafer conveying means (not shown) along a conveyance path, in front of the apparatus, and it is loaded on the wafer stage 7. After completion of a predetermined alignment operation, in the exposure apparatus, the scan exposure and stepwise motion are repeated so that the pattern of the reticle substrate 2 is transferred, by exposure, to different exposure regions on the wafer 6. In the scan exposure process, the reticle stage 1 and the Y stage 7C are moved in the Y direction (scan direction) at a predetermined speed ratio, such that the pattern of the reticle substrate 2 is scanned with slit-like exposure light and also that the wafer is scanned with a projected image thereof. By this, the pattern of the reticle substrate 2 is printed on a certain exposure region on the wafer 6. During the scan exposure, the level (height) of the wafer 6 surface is measured by means of the focus sensor, and the level and tilt of the wafer stage 7 is real-time controlled on the basis of the measured value, whereby focus correction is performed. When scan exposure of one exposure region is completed, the X stage 7B is moved in the X direction to move the wafer stepwise, so that another exposure region is positioned with respect to the scan exposure start position. Then, scan exposure is initiated. Here, in order that sequential exposures of exposure regions on the wafer 6 are performed efficiently on the basis of a combination of X-direction stepwise motion and Y-direction scan exposure movement, the disposition of exposure regions and positiveness/negativeness of Y scan direction as well as the order of exposure of these exposure regions are appropriately determined.

Figure 7A:
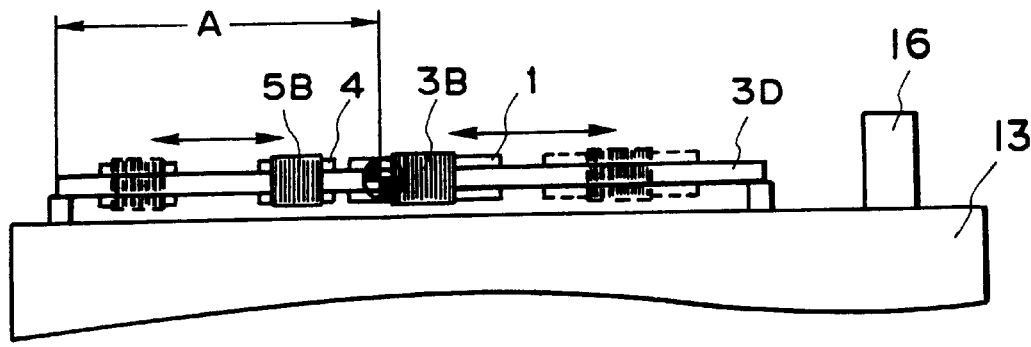
FIGS. 7A–7D are side views of the reticle stage of the FIG. 1 embodiment, respectively.
Figure 7B:
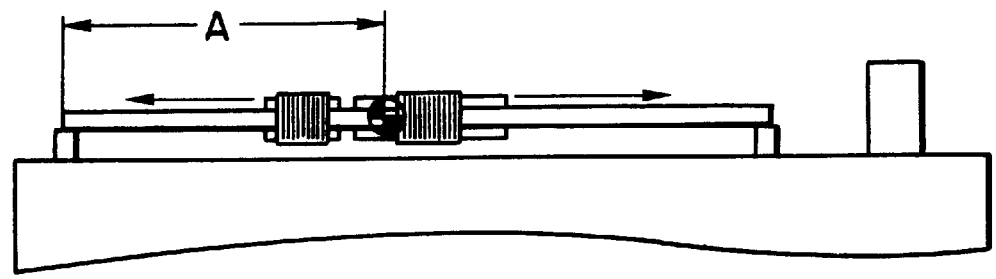

With the arrangement described above, for a synchronous scan of the reticle substrate 2 and the wafer 6 by the reticle stage 1, as shown in FIGS. 7A–7D the reticle stage 1 and the movable portion 4 move in directions opposite to each other. Here, FIG. 7B shows the positions of the reticle stage 1 and the movable portion 4 at the start of scan exposure. The gravity center of the whole weight of the reticle stage unit is at the position of distance A in the Y direction, from the stage end portion. As drive currents are applied to the coils 3A and 3B of the reticle stage 1 to perform scan exposure with the reticle stage, the movable portion 4 is also movement controlled in an opposite direction to the reticle stage 1 in response to application of drive currents to the coils 5A and 5B. As a result, the load gravity center of the reticle stage unit as a whole is unchanged and at the position in the distance A in the Y direction from the stage end portion, the same as the load gravity center prior to the scan exposure.

Figure 7C:
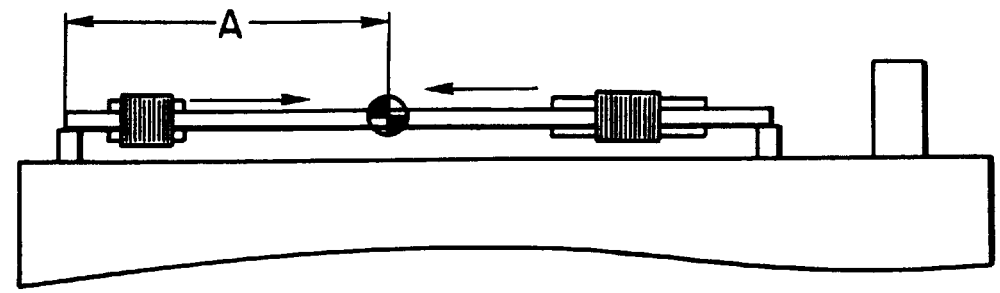
Figure 7D:
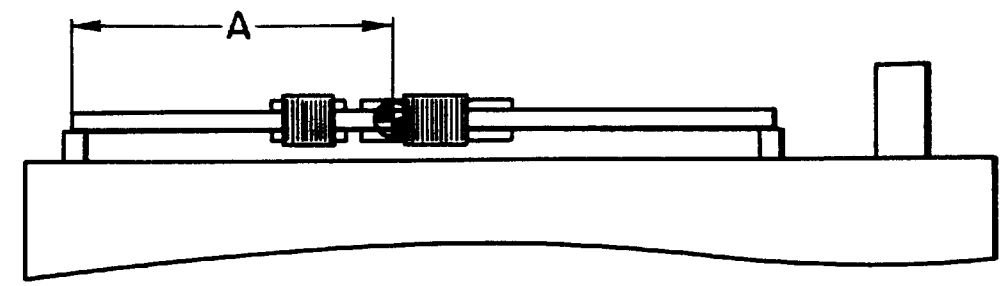

From the position shown in FIG. 7B to the position shown in FIG. 7C, the load gravity center is continuously unchanged and is at the position in the distance A in the Y direction from the stage end portion. Additionally, when the reticle stage 1 returns to its scan start position after completion of scan exposure, as shown in FIG. 7D the load gravity center is, as a matter of course, continuously unchanged and it is held at the position in the distance A in the Y direction from the stage end portion.

Figure 8A:
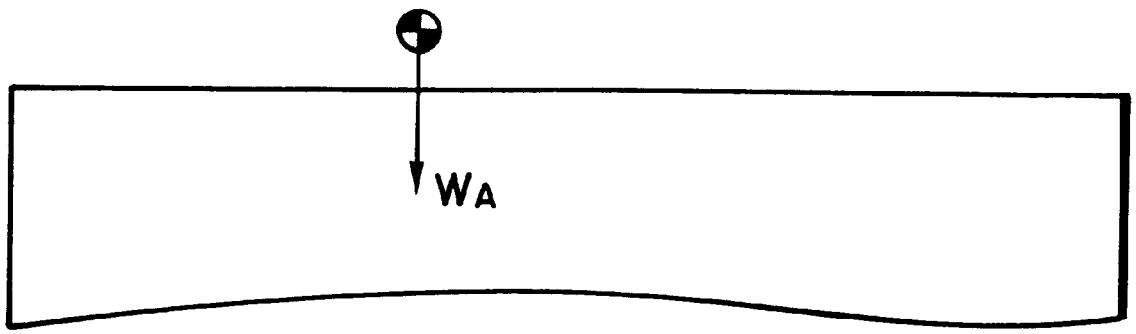
FIGS. 8A and 8B are schematic views, respectively, for explaining a load gravity center of the reticle stage of the FIG. 1 embodiment.
Figure 8B:
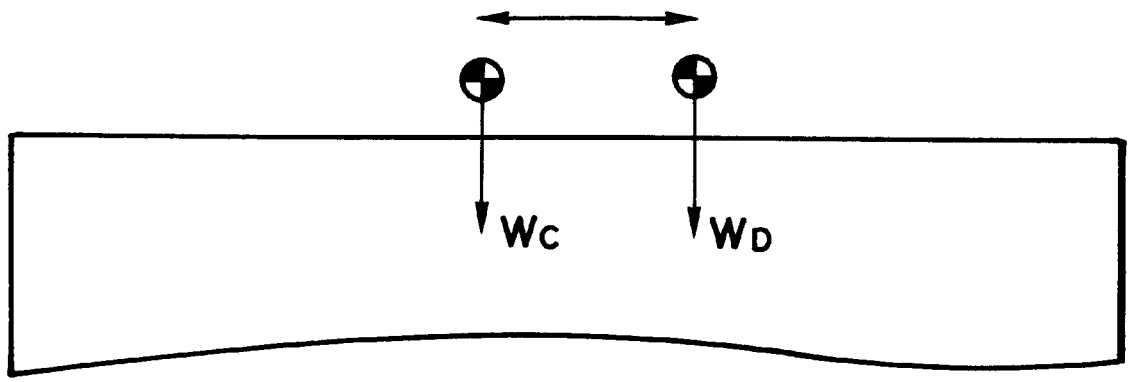

As described above, in this embodiment, by scanningly moving the movable portion 4 provided on the reticle stage 1 in the direction opposite to the reticle scan direction, as shown in FIG. 8A, there occurs no gravity center shift in the weight $W_A$ of the reticle stage unit as a whole. As a result, as shown in FIG. 8A, there occurs no deformation in the top plate 13A of the structural member 13 due to a load gravity center shift as in the example shown in FIG. 8B. Thus, stable scan exposure is assured.

Figure 9A:
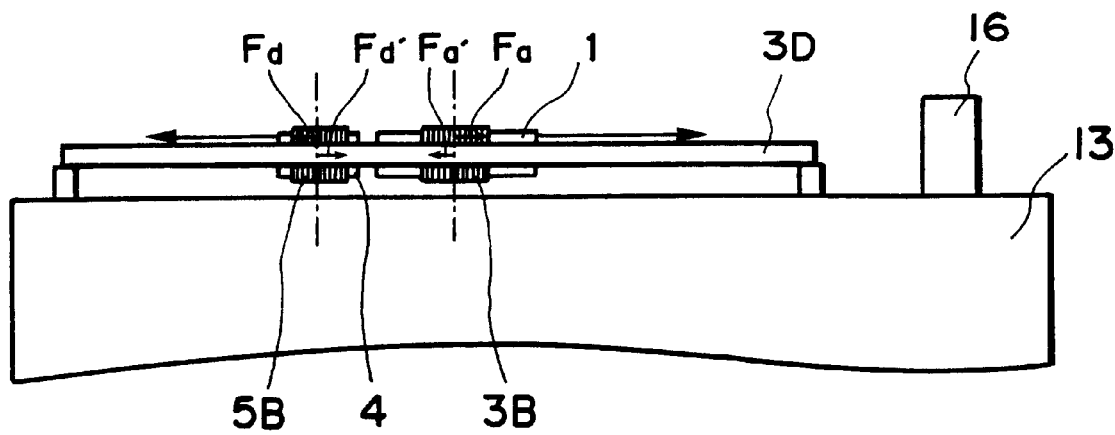
FIGS. 9A–9C are schematic views, respectively, for explaining a thrust and reaction force of the reticle stage in the FIG. 1 embodiment.
Figure 9B:
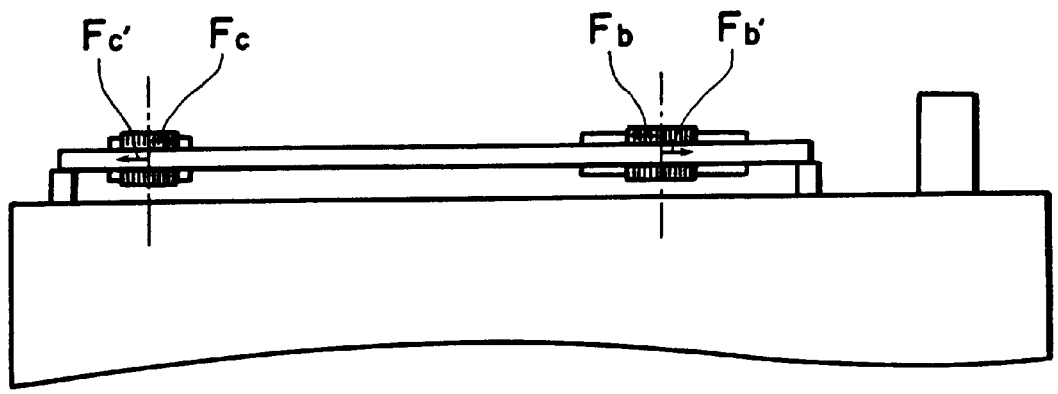
Figure 9C:
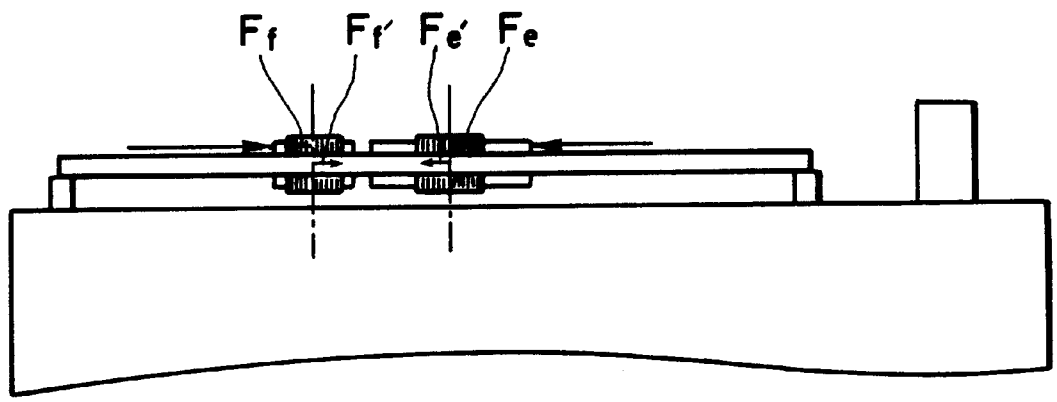
Figure 10A:
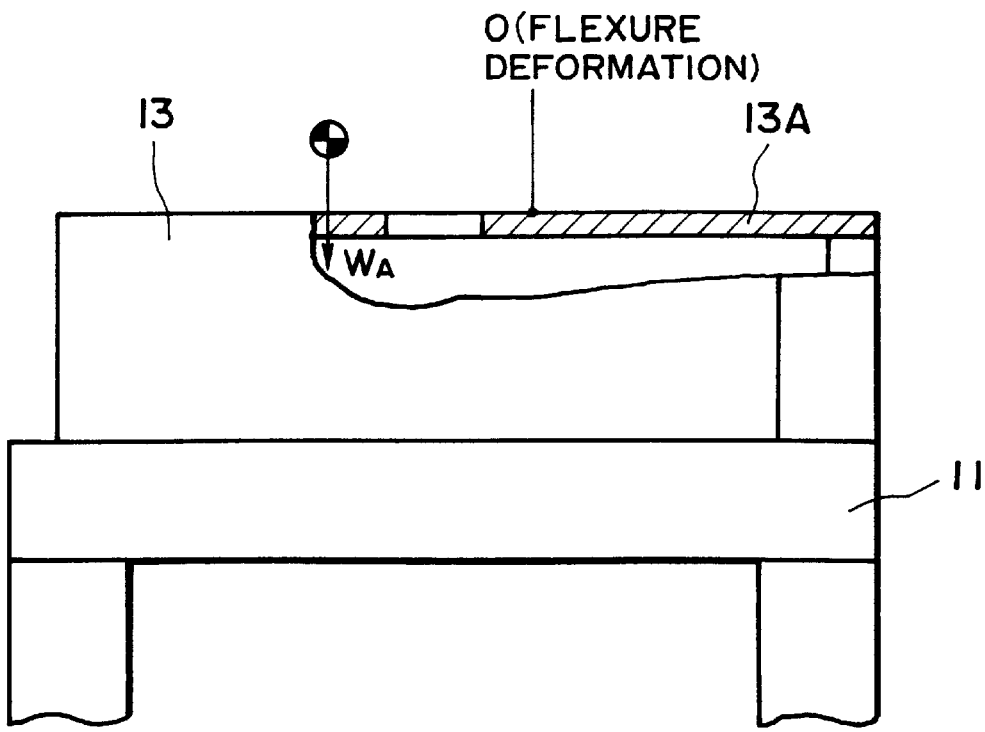
FIGS. 10A and 10B are schematic and side views, respectively, of the structural member in the exposure apparatus of the FIG. 1 embodiment.
Figure 10B:
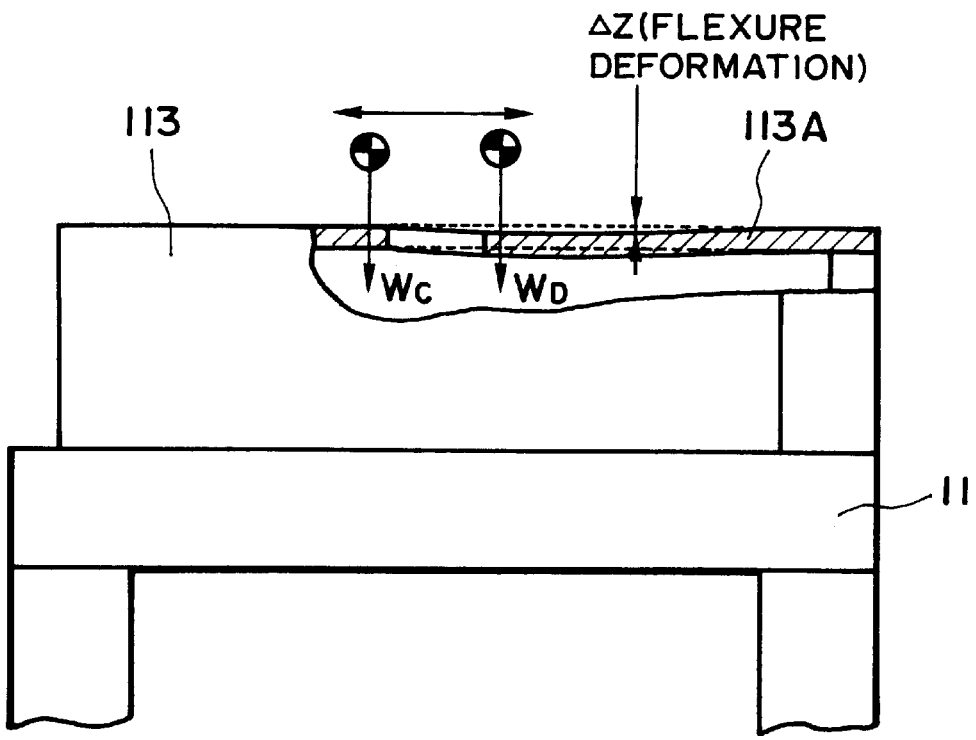

With the structure described above, for synchronous scan of the reticle substrate 2 and the wafer 6 by the reticle stage 1, as shown in FIGS. 9A–9C, the reticle stage 1 and the movable portion 4 move in directions opposite to each other. Here, FIG. 9A shows the positions of the reticle stage 1 and the movable portion 4 at the start of scan exposure. At the time of a start of scan, a thrust $F_a$ in a scanning movement direction is produced in the reticle stage 1 by means of drive currents applied to the coils 3A and 3B which are disposed on the opposite sides of the reticle stage 1. Simultaneously therewith, a reaction force $F_a'$ opposed to the thrust is produced in the yokes 3C and 3D which are disposed at the stationary side of the linear motor. Also, as drive currents are applied to the coils 5A and 5B provided on the opposite sides of the movable portion 4a, in synchronism with the drive currents to the reticle stage 1, a thrust $F_d$ is produced in the movable portion 4 such that the movable portion 4 is moved in a diametrically opposite direction to the scanning movement direction of the reticle stage 1. Simultaneously therewith, a reaction force $F_d'$ opposed to the thrust is produced in the yokes 3C and 3D which are provided at the stationary side of the linear motor. Here, the reaction forces $F_a'$ and $F_d'$ generated in the linear motor yokes produced in directions diametrically opposite to each other and, additionally, reaction forces of the same magnitude are produced. Therefore, reaction force vectors of them cancel with each other and, as a result of this, the reaction forces produced in the yokes 3C and 3D of the linear motor become approximately equal to zero.

FIG. 9B shows an inverse thrust $F_b$ and corresponding reaction force $F_b'$ at the time of deceleration and stoppage, at the end of scan. Also shown there are inverse thrust $F_e$ and corresponding reaction force $F_e'$ at the time of deceleration and stoppage of the movable portion 4. Also, in this case, like the scan start, reaction force vectors produced in the yokes 3C and 3D at the deceleration and stoppage are canceled with each other, and they become approximately equal to zero.

FIG. 9C shows inverse thrust $F_c$ and reaction force $F_c'$ at the time of deceleration and stoppage as the stage moves back to the scan start position after a completion of scan. Also shown there are inverse thrust $F_f$ and reaction force $F_f'$ at the time of deceleration and stoppage of the movable portion 4. Also in this case, like the scan start, the reaction force vectors produced in the yokes 3C and 3D at the time of deceleration and stoppage are canceled with each other and they become substantially equal to zero.

In the scan exposure according to this embodiment, as described above, there is no possibility that a reaction force produced in the yoke causes a small displacement or vibration of the structural member 13 and barrel base table 11. Thus, stable synchronous scan exposure is assured.

The manner of movement control for the movable portion 4 described above, will be explained below.

Figure 3:
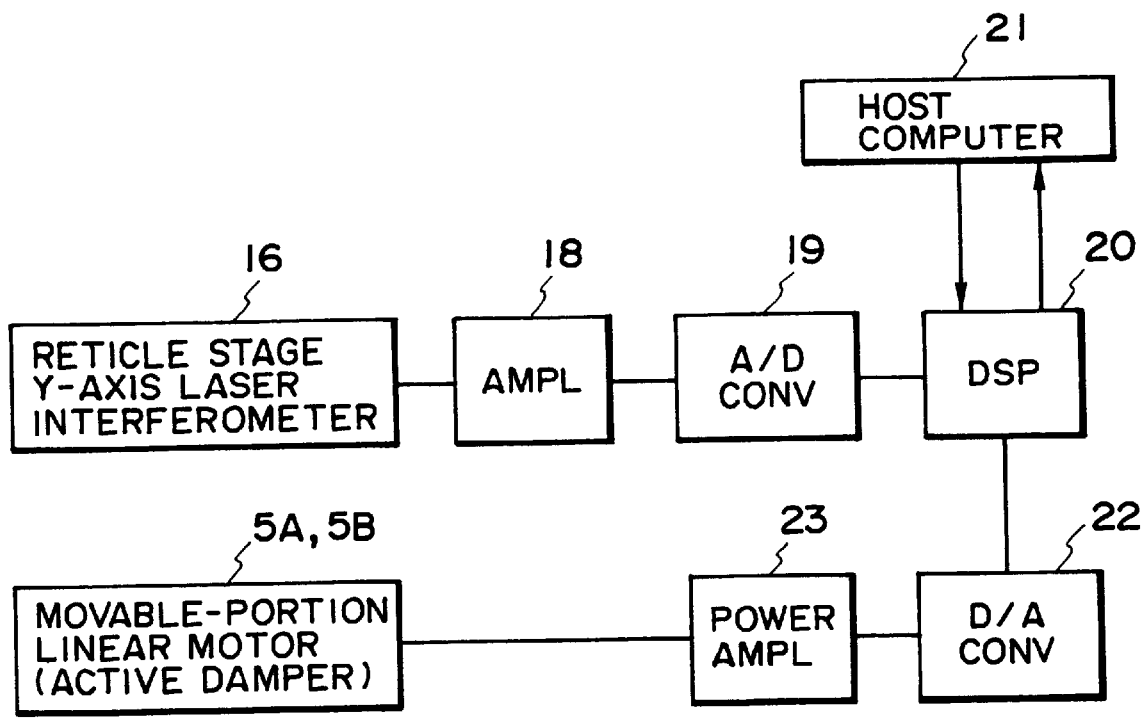
FIG. 3 is a block diagram of a control system for movable means in the apparatus of FIG. 1.
Figure 4:
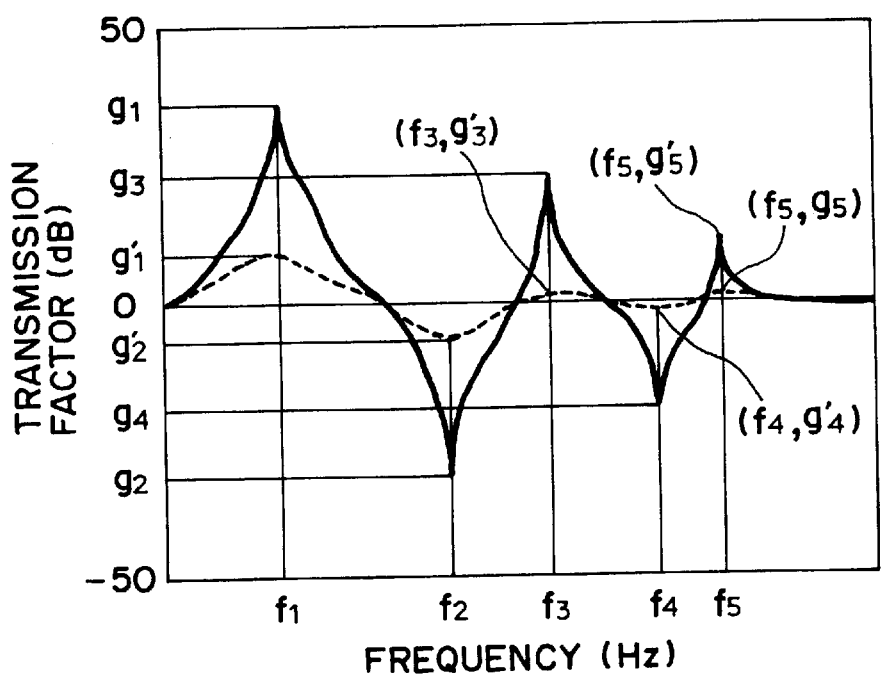
FIG. 4 is a graph for explaining a frequency characteristic of a reticle stage of the FIG. 1 embodiment.

FIG. 3 shows the structure of a control system for the movable portion. FIG. 4 shows a frequency characteristic based on measurement, with respect to drive frequency, of a transmission factor to the reticle stage yoke or stationary portion from the reticle stage drive signal. In FIG. 4, a solid line corresponds to a case where there is no active damper control (conventional), and a broken line corresponds to a case with an active damper control (the present embodiment).

As shown in FIG. 3, with the movement of the reticle stage 1 in the scan direction, an analog signal of a movement position of the reticle stage 1 in the Y direction is produced on the basis of measurement through the reticle stage Y-direction laser interferometer 16. This movement position analog signal is amplified by an amplifier 18 and, then, it is transformed into a digital signal by an analog-to-digital converter 19. In digital signal processor (DSP) 20, a computation operation is performed and, by means of a host computer 21, the result is processed as control information. Based on this, the host computer 21 supplies control information for the active damper, constituting the movable portion 4 and linear motor coils 5A and 5B, and applies it to the digital signal processor 20. Then, the processor 20 calculates and outputs a digital signal which is an active damper control signal. This output is transformed by a digital-to-analog converter 22, from a digital signal to an analog signal. The thus produced analog signal is then amplified by an analog signal power amplifier 23, to an electric current of a level sufficient to drive the linear motor coils 5A and 5B. Thus, drive currents are applied to the linear motor coils 5A and 5B, and the movable portion 4 is drive controlled so as to cancel the load gravity center shift, produced with the scan movement of the reticle stage 1, as well as a reaction force produced in the linear motor stationary side.

FIG. 4 shows a frequency characteristic based on measurement, in terms of drive frequency, of a transmission factor to the reticle stage yokes 3C and 3D or to the stationary portion from the reticle stage drive signal, in a case with active damper control as described and in a case without such active damper control. A solid line corresponds to a case without active damper control. As shown, at frequencies f1, f2, f3, f4, . . . , there occur vibration modes (first-order mode, second-order mode, third-order mode, . . . ) which are produced in the reticle stage yokes 3C and 3D and at the stationary side, as a result of a reaction force described above when the driving coils 3A and 3B of the reticle stage 1 function as a vibration source. A broken line in the drawing shows a curve fit when an active damper control of movable portion 4 and linear motor coils 5A and 5B as described above is applied. As illustrated, it is seen that the resonance peak g1 at the frequency f1 is suppressed in amplitude to a peak g1', by the active damper control. Similarly, the resonance peak at the frequency f2 is suppressed, from g2 to g2'. By widening the active damper control range sufficiently, as depicted by the broken line in FIG. 4 the resonance peak can be suppressed by means of the active damper, up to the fifth-order mode (f5).

As described, drive control of active damper may be performed while detecting the scan movement position of the reticle stage 1 and, by doing so, the reaction force produced in the reticle stage unit can be canceled.

While in the above-described example the linear motor 3 for driving the reticle stage 1 uses a yoke as its stationary side and a coil as its movable side, the present embodiment can be applied similarly where a magnet is used as the movable side and a coil is used as the stationary side. On that occasion, a coil supporting member for supporting the stationary side coil may be used in common as the magnetic circuit of the active damper.

In accordance with this embodiment of the present invention, a movable portion being movable in a direction opposite to the scan movement direction of the reticle stage as well as driving means therefore (dynamic damper) may be provided so that a reticle stage guide and a stationary side yoke (where a coil is provided at the movable side) or a coil supporting member (where a magnet is provided at the movable side) of the magnetic circuit may be used in common. The movable portion may be movement controlled so as to cancel a shift of weight gravity center of the reticle stage and a reaction force produced in the linear motor stationary side, such that the movable portion functions as a dynamic damper. Then, there occurs no gravity center shift of the weight of the reticle stage unit as a whole, and stable scan exposure without deformation of the structural member of the exposure apparatus is assured. Thus, exposure precision and throughput are improved.

Further, in accordance with this embodiment of the present invention, a movable portion being movable in a direction opposite to the scan movement direction of the reticle stage as well as driving means therefore (dynamic damper) may be provided so that a reticle stage guide and a stationary side yoke (where a coil is provided at the movable side) or a coil supporting member (where a magnet is provided at the movable side) of the magnetic circuit may be used in common. This ensures that a reaction force vector of a reaction force produced in the linear motor yoke is canceled, such that there occurs no small displacement or vibration of the structural member of the exposure apparatus or of the barrel base table due to a reaction force produced in the yoke. Thus, stable synchronous scan exposure is assured, and exposure precision and throughput are improved.

Additionally, a drive reaction force produced during the motion of the reticle stage is canceled within the stage, and there is no necessity of using a large structural member for releasing such a reaction force to the outside of the apparatus. Thus, the exposure apparatus can be made compact.

Figure 11A:
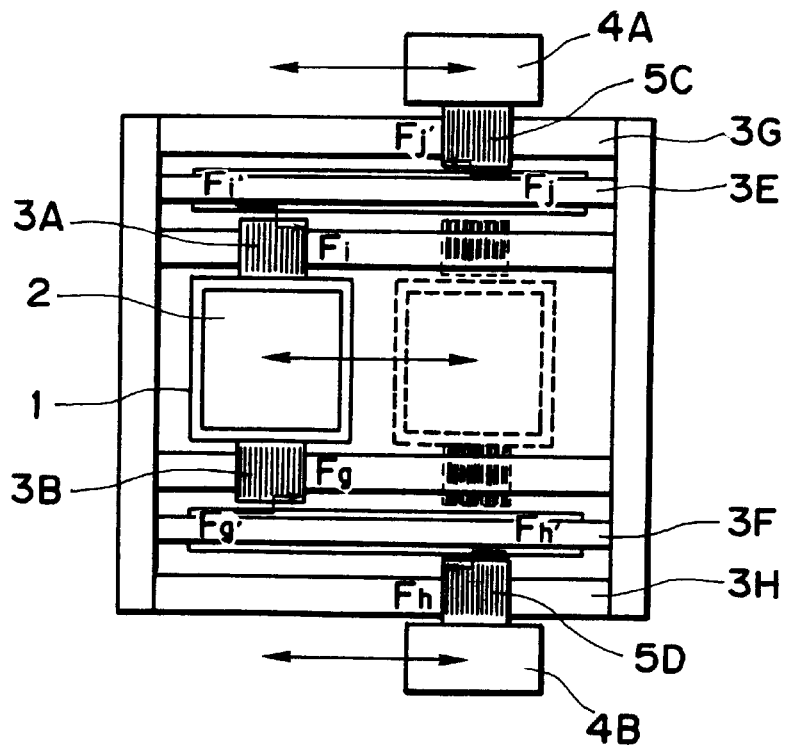
FIGS. 11A–11C are a top view and side views, respectively, of a reticle stage according to another embodiment of the present invention.
Figure 11B:
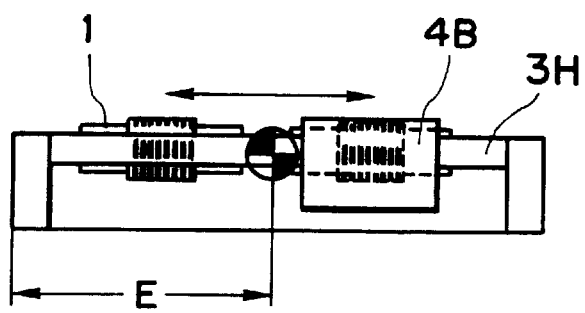
Figure 11C:
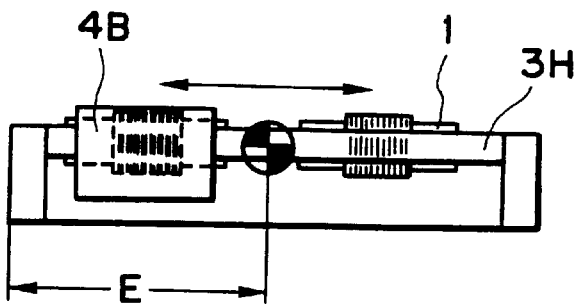

In the above-described embodiment, the movable portion which is movable in a direction opposite to the scan direction of the reticle stage and which functions as a dynamic damper, moves while being guided by a guide having the same axis as that of the reticle stage, and also, the driving means is driven by the same yoke. However, as shown in FIG. 11A, linear motor yokes 3E and 3F of the reticle stage 1 may be used in common, and there may be provided movable portions 4A and 4B having guides 3G and 3H separately outside the axis. Also, with this arrangement, as the reticle stage 1 and the movable portions 4A and 4B are scanningly moved, scan exposure is performed without a shift of the weight gravity center of the stage unit, as shown in FIGS. 11B and 11C, from the position in the distance E from the stage end face. Further, at the start of scan exposure, drive currents are applied to driving coils 3A and 3B of the reticle stage 1, and thrusts $F_i$ and $F_g$ are produced in relation to these coils. Thus, reaction forces $F_i'$ and $F_g'$ are produced simultaneously in the linear motor yokes 3E and 3F. Also, electric currents for moving the movable portions 4A and 4B in a direction opposite to the reticle stage 1 are supplied to coils 5C and 5D, to cause thrusts $F_h$ and $F_j$ to be produced in these coils. At the same time, reaction forces $F_h'$ and $F_j'$ of the same magnitude as the reaction forces $F_j'$ and $F_g'$ are produced in the linear motor coils 3F and 3G, respectively. As a result, the sum of reaction force vectors produced in the linear motor yokes 3F and 3G are canceled, and the reaction force produced becomes substantially equal to zero. Thus, substantially the same advantageous results with the preceding embodiment are attainable with this embodiment.

In accordance with these embodiments of the present invention, deformation, small displacement or vibration of a structural member of an exposure apparatus or of a barrel base table, due to movement of a stage for scan of an original, during the scan exposure, can be avoided or reduced. Thus, stable synchronous scan exposure is assured, and exposure precision and throughput are improved. Further, since there is no necessity of use of a large structure for releasing a reaction force, resulting from scan stage movement, to the outside of the apparatus, the exposure apparatus can be made compact.

Next, an embodiment of a device manufacturing method which uses an exposure apparatus or exposure method such as described above, will be explained.

Figure 12:
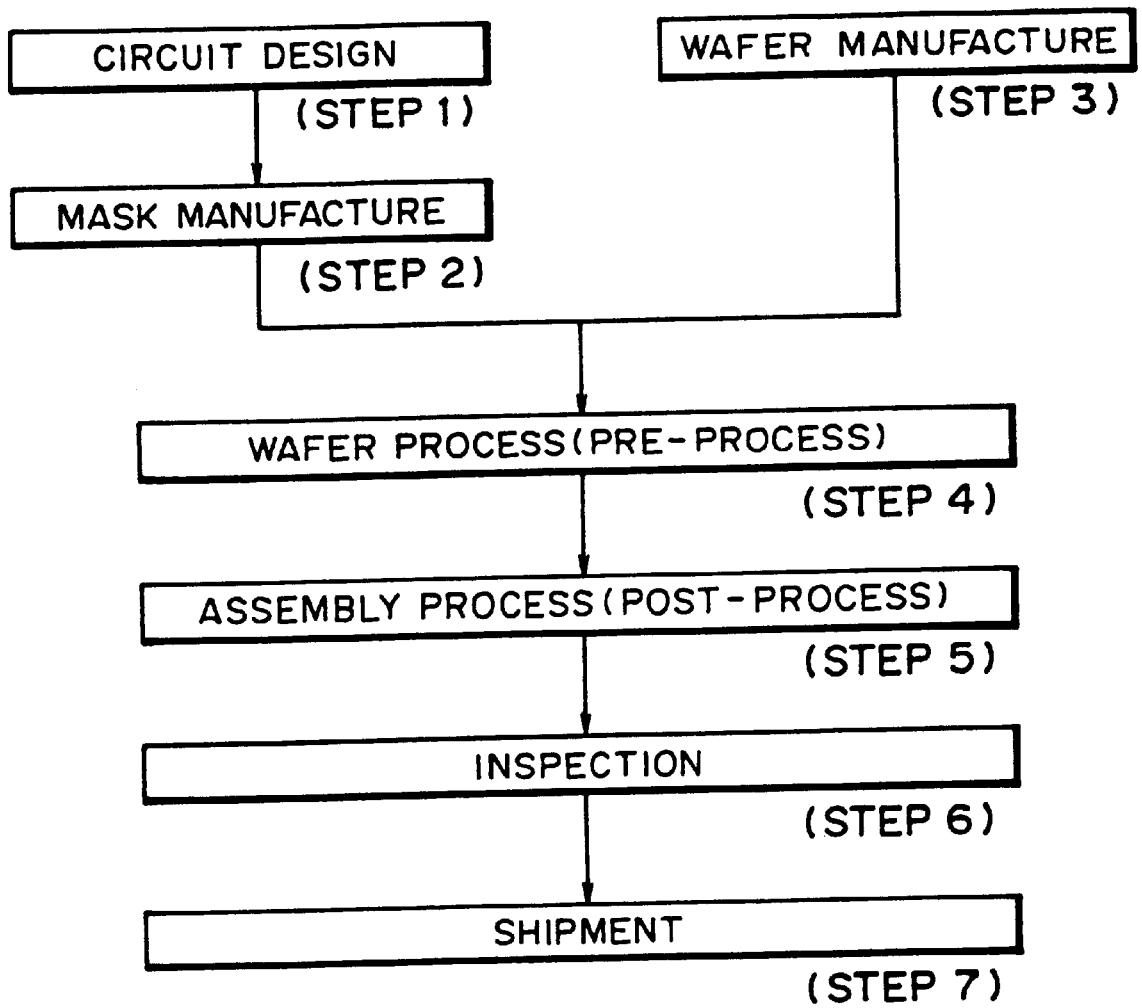
FIG. 12 is a flow chart of microdevice manufacturing processes.

FIG. 12 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 13:
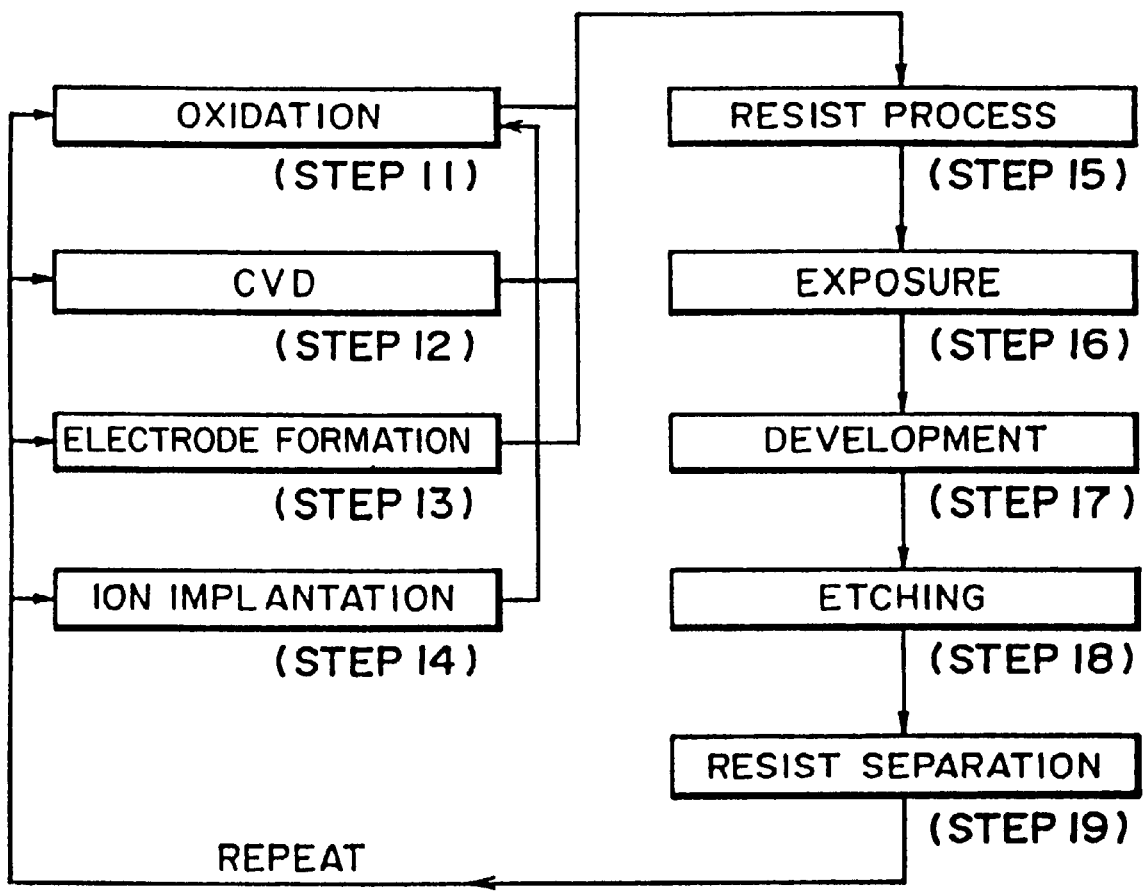
FIG. 13 is a flow chart for explaining details of a wafer process in the procedure of FIG. 12.
Figure 14:
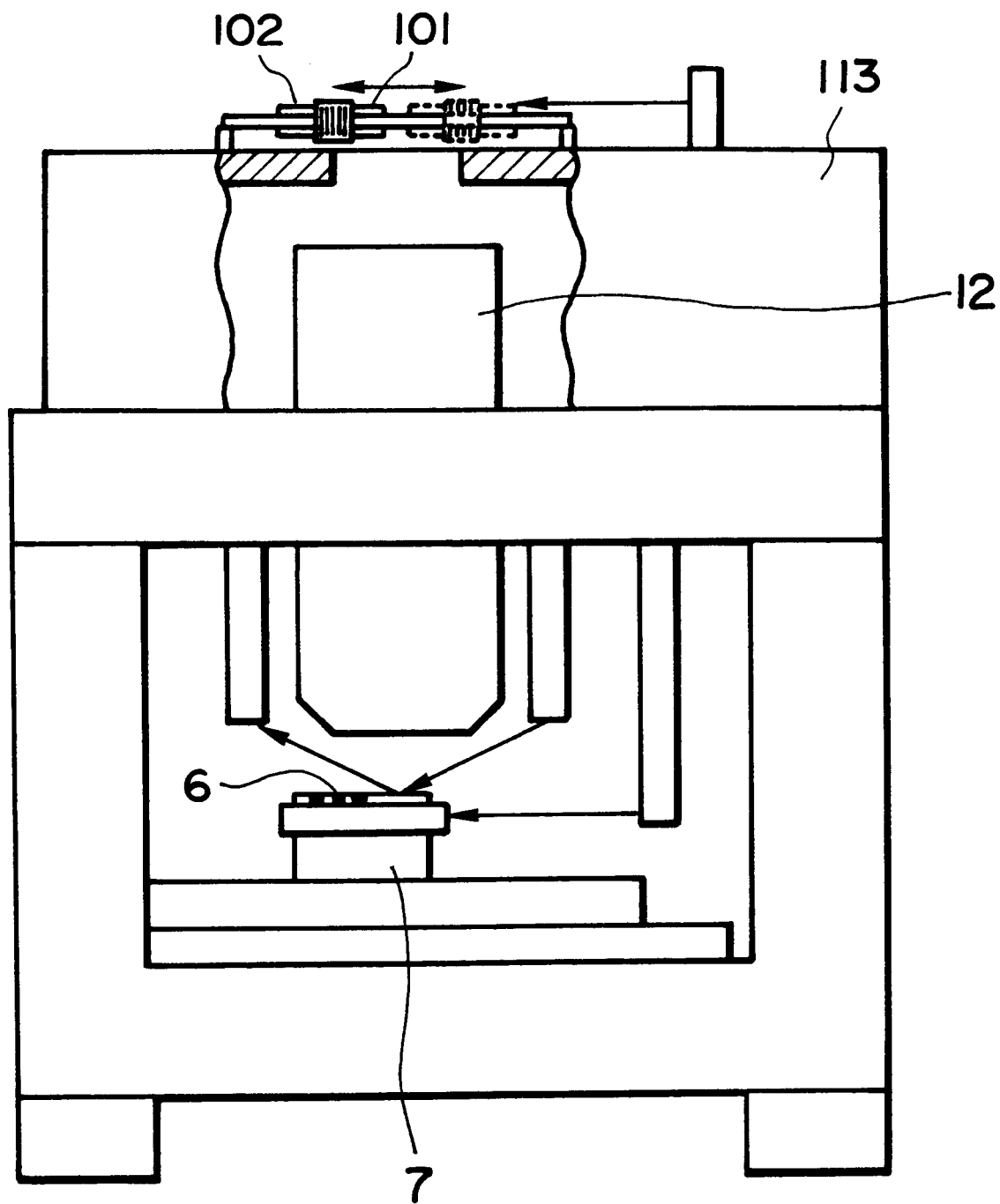
FIG. 14 is a schematic view of a conventional exposure apparatus.
Figure 15:
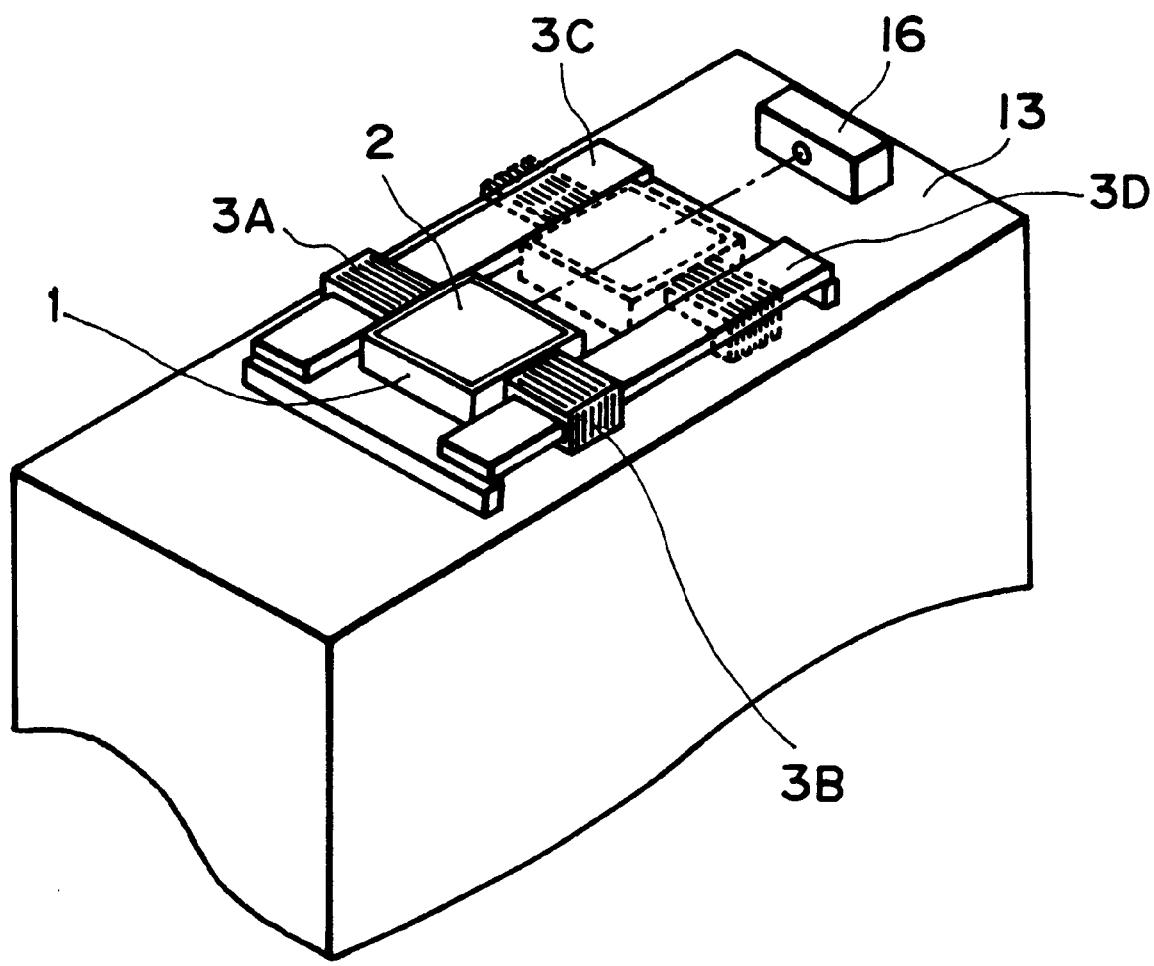
FIG. 15 is a perspective view of a reticle stage of the exposure apparatus of FIG. 14.
Figure 16A:
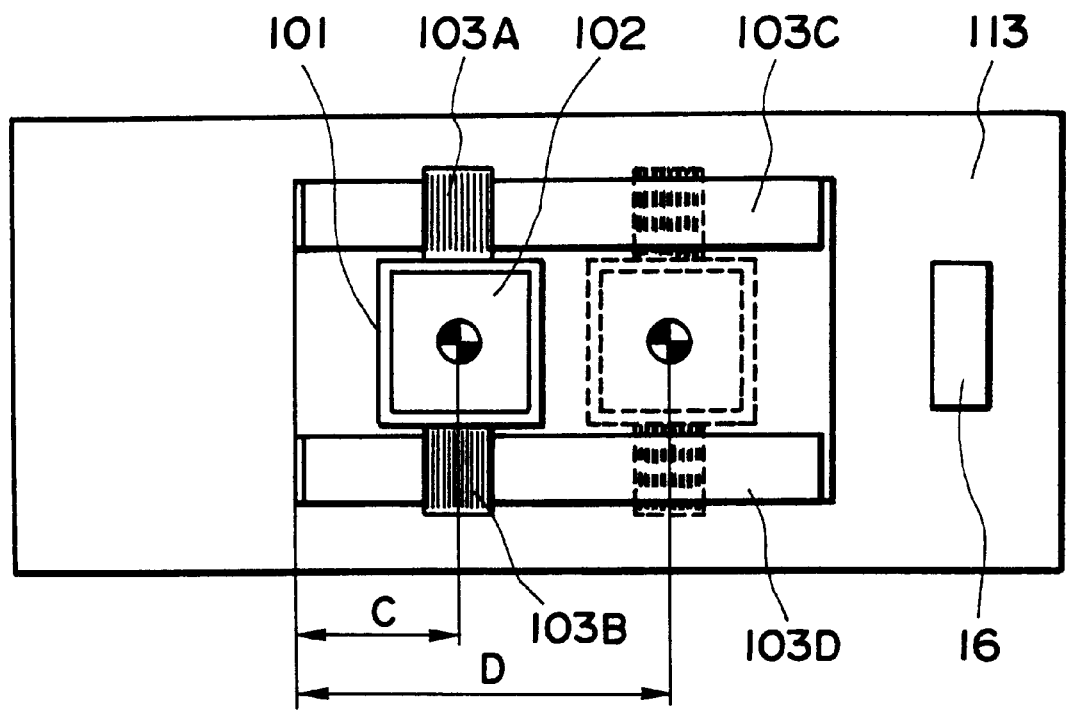
FIGS. 16A and 16B are a top view and side view, respectively, of the reticle stage of the exposure apparatus of FIG. 14.
Figure 16B:
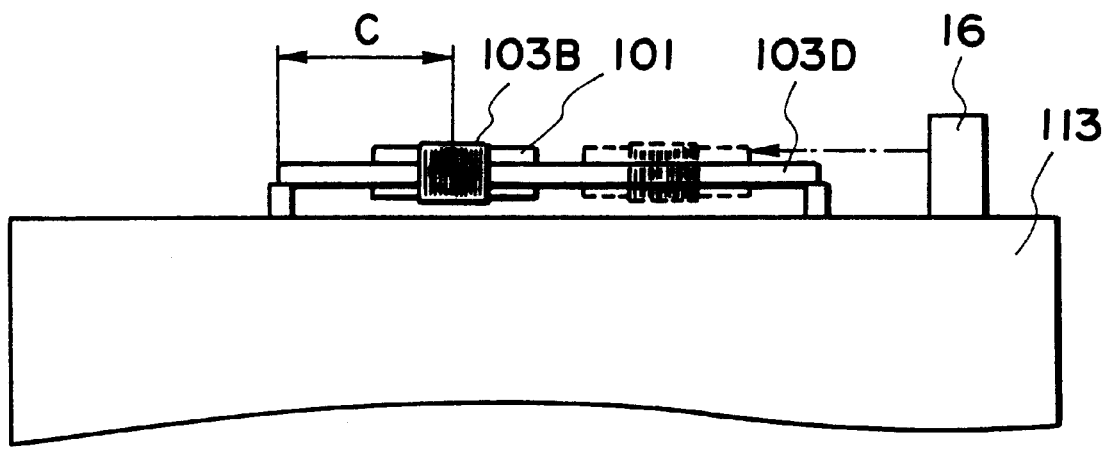
Figure 17A:
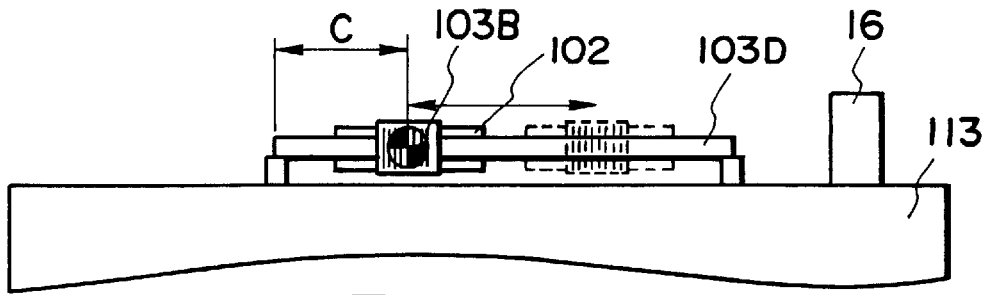
FIGS. 17A–17E are schematic views, respectively, for explaining a load gravity center of the reticle stage of the exposure apparatus of FIG. 14.
Figure 17B:
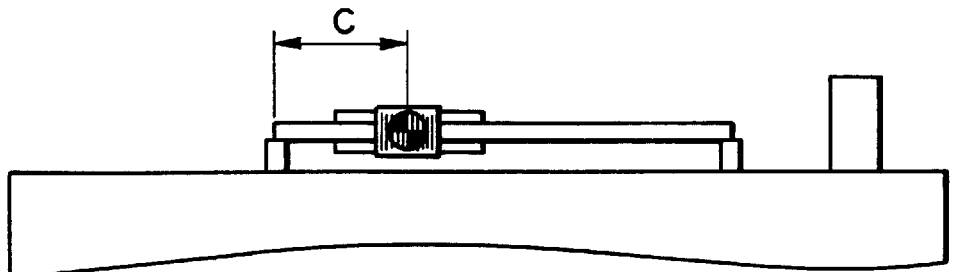
Figure 17C:
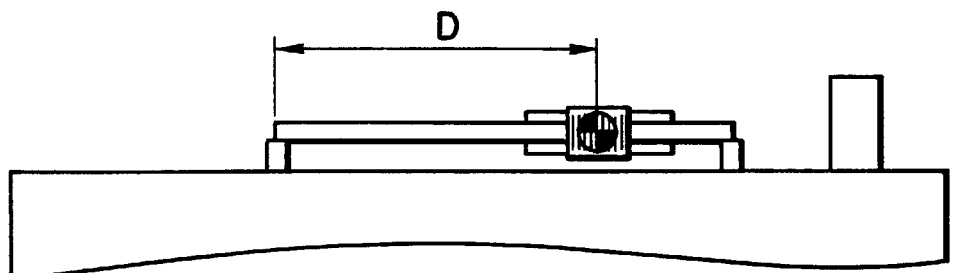
Figure 17D:
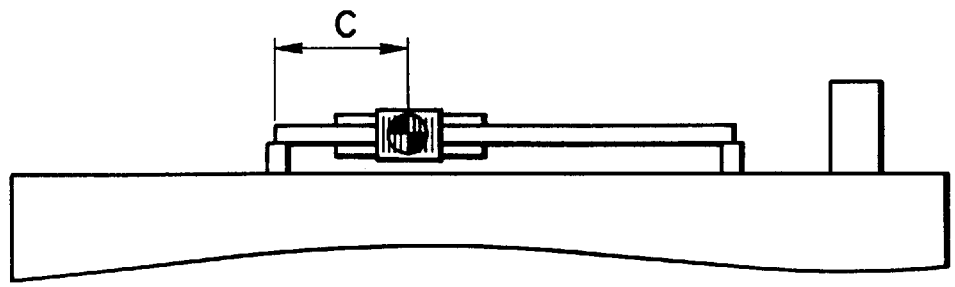
Figure 17E:
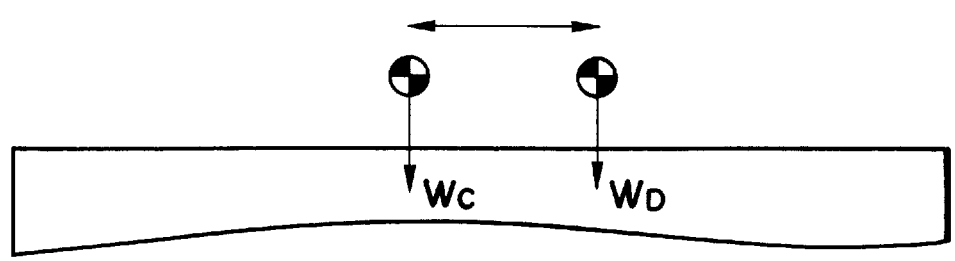
Figure 18A:
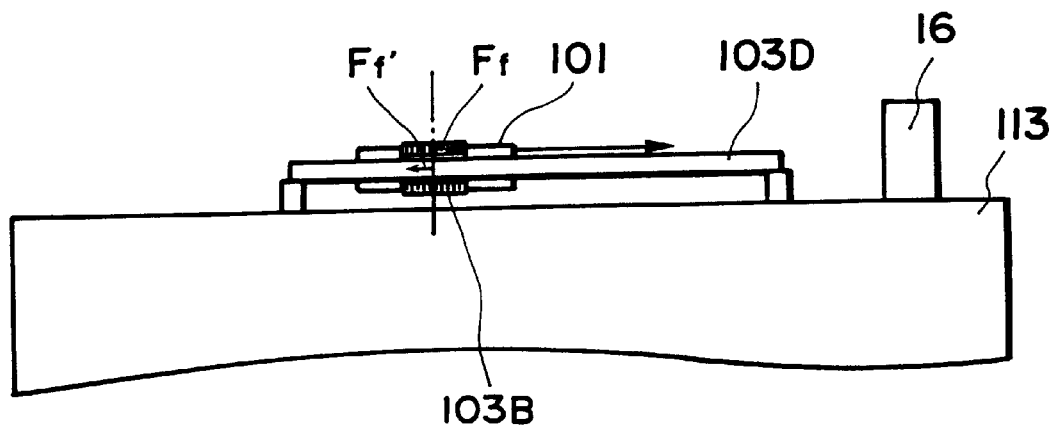
FIGS. 18A–18C are schematic views, respectively, for explaining a thrust and reaction force of the reticle stage of the exposure apparatus of FIG. 14.
Figure 18B:
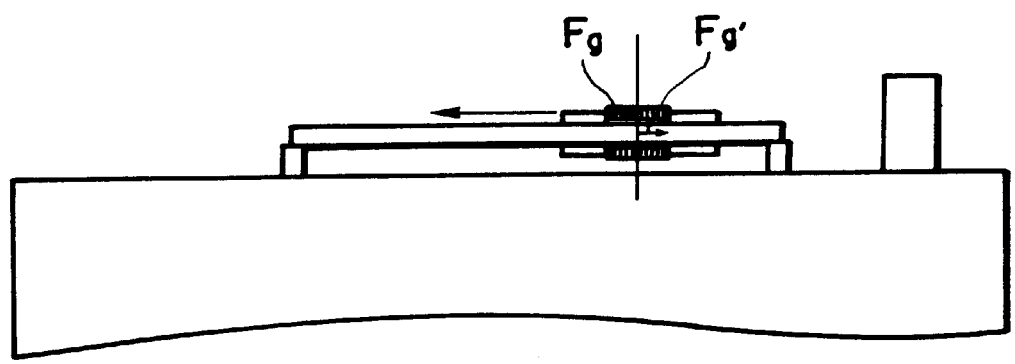
Figure 18C:
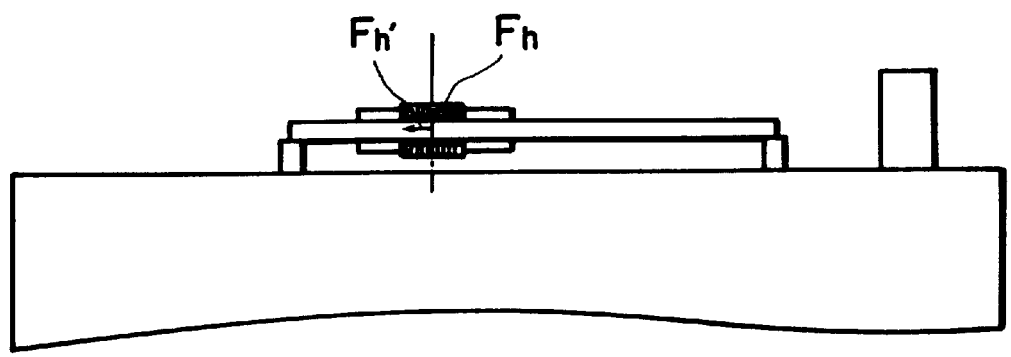

FIG. 13 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   a projection optical system for projecting, in a slit, a pattern of an original onto a substrate, while the original is held by a stage and is moved in a scan direction, along a straight line;
   scanning means for relatively and scanningly moving the original and the substrate relative to said projection optical system, such that, in association with said projection optical system, the pattern of the original is transferred to the substrate; and
   a movable member being movable along the same straight line as that of the scan direction of the stage for holding the original, wherein a stationary element of said movable member and a stationary element of the stage are fixedly connected to a common structural member, and in a scan exposure, the stage and said movable member move in synchronism with each other, along the same straight line and in directions opposite to each other.

2. An apparatus according to claim 1, further comprising detecting means for detecting one of acceleration and position of the original with respect to the scan direction, and wherein said movable member and the stage are drive- controlled on the basis of a detection signal produced by said detecting means.

3. An apparatus according to claim 1, wherein the stage and said movable member are guided by a common guide member so that they are synchronously moved along the same axis as defined by said guide member.

4. An apparatus according to claim 1, wherein the stage and said movable member are driven by linear motor means having a common stator.

5. An apparatus according to claim 4, wherein said linear motor means includes (i) a moving coil provided at a movable side, (ii) a magnet and a yoke provided at a stationery side, and wherein said stage and said movable member commonly use at least one of the magnet and yoke.

6. An apparatus according to claim 4, wherein said linear motor means includes (i) a moving magnet provided at a movable side and (ii) a coil and a coil support provided at a stationery side, and wherein said stage and said movable member commonly use at least one of the coil and the coil support.

7. A device manufacturing method comprising:
   providing a projection optical system for projecting, in a slit, a pattern of an original onto a substrate, while the original is held by a stage and is moved in a scan direction, along a straight line;
   relatively and scanningly moving the original and the substrate relative to the projection optical system, such that, in association with the projection optical system, the pattern of the original is transferred to the substrate;
   providing a movable member being movable along the same straight line as that of the scan direction of the stage for holding the original, wherein a stationary element of the movable member and a stationary element of the stage are fixedly connected to a common structural member, and in a scan exposure the stage and the movable member move in synchronism with each other, along the same straight line and in directions opposite to each other; and
   performing an exposure process using the projection optical system to manufacture a device.

8. A stage mechanism, comprising:
   a stage being movable while carrying thereon an article to be conveyed, the stage being movable in a scan direction, along a straight line;
   a movable member being movable along the same straight line as that of the scan direction of said stage, wherein a stationary element of said movable member and a stationary element of said stage are fixedly connected to a common structural member; and
   linear motor means for moving said stage and said movable member, wherein said stage and said movable member are moved by said linear motor means in synchronism with each other, along the same straight line and in opposite directions.

9. An exposure apparatus, comprising:
   a projection optical system for projecting, in a slit, a pattern of an original onto a substrate;
   a stage being movable in a scan direction, along a straight line;
   a movable member being movable along the same straight line as that of the scan direction of said stage, wherein a stationary element of said movable member and a stationary element of said stage are fixedly connected to a common structural member; and
   linear motor means having a common stator for moving said stage and said movable member, wherein said linear motor means moves said stage and said movable member in synchronism with each other, along the same straight line and in opposite directions.

10. An apparatus according to claim 9, wherein said stage and said movable member are disposed along the same plane.

11. An apparatus according to claim 9, wherein in the scan exposure, said stage and said movable member move in opposite directions to each other.

12. An apparatus according to claim 9, wherein said stage and said movable member move in synchronism with each other.

13. An apparatus according to claim 9, further comprising detecting means for detecting one of acceleration and position of the original with respect to the scan direction, and wherein said movable member and said stage are drive-controlled on the basis of a detection signal produced by said detecting means.

14. An apparatus according to claim 9, wherein said stage and said movable member are guided by a common guide member so that they are synchronously moved along the same axis as defined by said guide member.

15. An apparatus according to claim 9, wherein said linear motor means includes (i) a moving coil provided at a movable side and (ii) a magnet and a yoke provided at a stationary side, and wherein said stage and said movable member commonly use at least one of the magnet and the yoke.

16. An apparatus according to claim 9, wherein said linear motor means includes (i) a moving magnet provided at a movable side (ii) a coil and a coil support provided at a stationary side, and wherein said stage and said movable member commonly use at least one of the coil and the coil support.

17. A device manufacturing method comprising:
providing a projection optical system for projecting, in a slit, a pattern of an original onto a substrate;
providing a stage being movable in a scan direction, along a straight line, and a movable member being movable along the same straight line as that of the stage, wherein a stationary element of the movable member and a stationary element of the stage are fixedly connected to a common structural member;
providing linear motor means having a common stator for moving the stage and the movable member, and moving, by the linear motor means, the stage and the movable member in synchronism with each other, along the same straight line and in opposite directions; and
performing an exposure process using the projection optical system to manufacture a device.

18. A stage mechanism, comprising:
a stage being movable in a scan direction along a straight line;
a movable member being movable along the same straight line as that of the scan direction of said stage, wherein a stationary element of said movable member and a stationary element of said stage are fixedly connected to a common structural member; and
linear motor means, having a common stator, for moving said stage and said movable member, wherein said linear motor means moves said stage and said movable member in synchronism with each other, along the same straight line and in opposite directions.

19. An exposure apparatus, comprising:
a projection optical system for projecting, in a slit, a pattern of an original onto a substrate; and
a stage unit having a stage and a movable member, said stage being movable in a scan direction, along a straight line, and said movable member being movable in a direction parallel to the scan direction,
wherein a stationary element of said movable member and a stationary element of said stage are fixedly connected to a common structural member and said stage and said movable member move along the same straight line and in opposite directions to each other, to compensate for a shift of weight of a gravity center of said stage unit.

20. An apparatus according to claim 19, wherein said stage and said movable member are disposed along the same plane.

21. An apparatus according to claim 19, further comprising detecting means for detecting one of acceleration and position of the original with respect to the scan direction, and wherein said movable member and stage are drive-controlled on the basis of a detection signal produced by said detecting means.

22. An apparatus according to claim 19, wherein said stage and said movable member are guided by a common guide member so that they are synchronously moved along the same axis as defined by said guide member.

23. An apparatus according to claim 19, wherein said stage and said movable member are driven by linear motor means having a common stator.

24. An apparatus according to claim 19, wherein said movable member includes (i) a moving coil provided at a movable side, (ii) a magnet and a yoke provided at a stationary side, and wherein said stage and said movable member commonly use at least one of the magnet and yoke.

25. An apparatus according to claim 19, wherein said movable member includes (i) a moving magnet provided at a movable side and (ii) a coil and a coil support provided at a stationary side, and wherein said stage and said movable member commonly use at least one of the coil and the coil support.

26. A device manufacturing method comprising:
providing a projection optical system for projecting, in a slit, a pattern of an original onto a substrate;
providing a stage unit having a stage and a movable member, the stage being movable in a scan direction along a straight line, and the movable member being movable in a direction parallel to the scan direction, wherein a stationary element of the movable member and a stationary element of the stage are fixedly connected to a common structural member and the stage and the movable member move along the same straight line and in opposite directions to each other, to compensate for a shift of a weight gravity center of the stage unit; and
performing an exposure process using the projection optical system, to manufacture a device.

27. An exposure apparatus, including a stage mechanism that comprises:
a stage being movable while carrying thereon an article to be conveyed;
a movable member being movable in a direction parallel to the movement direction of said stage;
a common guide member for guiding said stage and said movable member so that said stage and said movable member are synchronously moved along the same axis as defined by said guide member; and
linear motor means for moving said stage and said movable member, wherein said stage and said movable member are moved by said linear motor means in synchronism with each other, along the same straight line and in opposite directions to each other.

28. An exposure apparatus, comprising:

a projection optical system for projecting, in a slit, a pattern of an original onto a substrate;

a stage unit having a stage being movable in a scan direction and gravity center compensating means for compensating for any shift of a weight gravity center of said stage unit during movement of said stage;

a movable member being movable in a direction parallel to the movement direction of said stage; and a common guide member for guiding said stage and said movable member so that said stage and said movable member are synchronously moved alone the same axis as defined by said guide member.

* * * * *

UNITED STATES PATENT AND TRADEMARK OFFICE
CERTIFICATE OF CORRECTION

PATENT NO.     : 6,262,794 B1
DATED          : July 17, 2001
INVENTOR(S)    : Yoshikazu Miyajima It is certified that error appears in the above-identified patent and that said Letters Patent is hereby corrected as shown below:

Column 4,
Line 9, "is" should read -- is a --.

Column 5,
Line 39, "e" should read -- Θ --.

Column 8,
Line 3, "yokes.3C" should read -- yokes 3C --.
Line 23, "of" should read -- of a --.

Column 13,
Line 30, "side" should read -- side, --.

Column 16,
Line 5, "alone" should read -- along --.

Signed and Sealed this

Twenty-sixth Day of February, 2002

Attest:

JAMES E. ROGAN
Attesting Officer        Director of the United States Patent and Trademark Office